United States Patent
Carpenter, Jr. et al.

(10) Patent No.: US 7,995,316 B2
(45) Date of Patent: Aug. 9, 2011

(54) INTEGRATED ESD PROTECTION DEVICE

(75) Inventors: John H. Carpenter, Jr., Rowlett, TX (US); Wayne Tien-Feng Chen, Plano, TX (US); Andrew D. Mitchell, Garland, TX (US)

(73) Assignee: Texas Instruments Incorporated, Dallas, TX (US)

( * ) Notice: Subject to any disclaimer, the term of this patent is extended or adjusted under 35 U.S.C. 154(b) by 223 days.

(21) Appl. No.: 12/471,948

(22) Filed: May 26, 2009

(65) Prior Publication Data

US 2009/0230426 A1    Sep. 17, 2009

Related U.S. Application Data

(62) Division of application No. 11/499,576, filed on Aug. 4, 2006, now abandoned.

(51) Int. Cl.
*H02H 9/00* (2006.01)

(52) U.S. Cl. .......................................................... 361/56

(58) Field of Classification Search ...................... 361/56
See application file for complete search history.

(56) References Cited

U.S. PATENT DOCUMENTS

| | | | |
|---|---|---|---|
| 5,225,702 A | 7/1993 | Chatterjee | |
| 5,780,905 A | 7/1998 | Chen et al. | |
| 6,610,262 B1 * | 8/2003 | Peng et al. | 423/197 |
| 7,285,458 B2 * | 10/2007 | Manna et al. | 438/237 |
| 7,615,417 B2 * | 11/2009 | Manna et al. | 438/133 |
| 2004/0026728 A1 | 2/2004 | Yoshida et al. | |

* cited by examiner

*Primary Examiner* — Stephen W Jackson
(74) *Attorney, Agent, or Firm* — William B. Kempler; Wade J. Brady, III; Frederick J. Telecky, Jr.

(57) ABSTRACT

An integrated electrostatic discharge (ESD) device includes a first ESD structure coupled to a pad terminal of the integrated ESD device and a second ESD structure coupled to a ground terminal of the integrated ESD device. The integrated ESD device also comprises a diffusion region that is shared by each of the first ESD structure and the second ESD structure, such that the shared diffusion region forms a portion of at least one semiconductor junction associated with each of the first ESD structure and the second ESD structure.

14 Claims, 2 Drawing Sheets

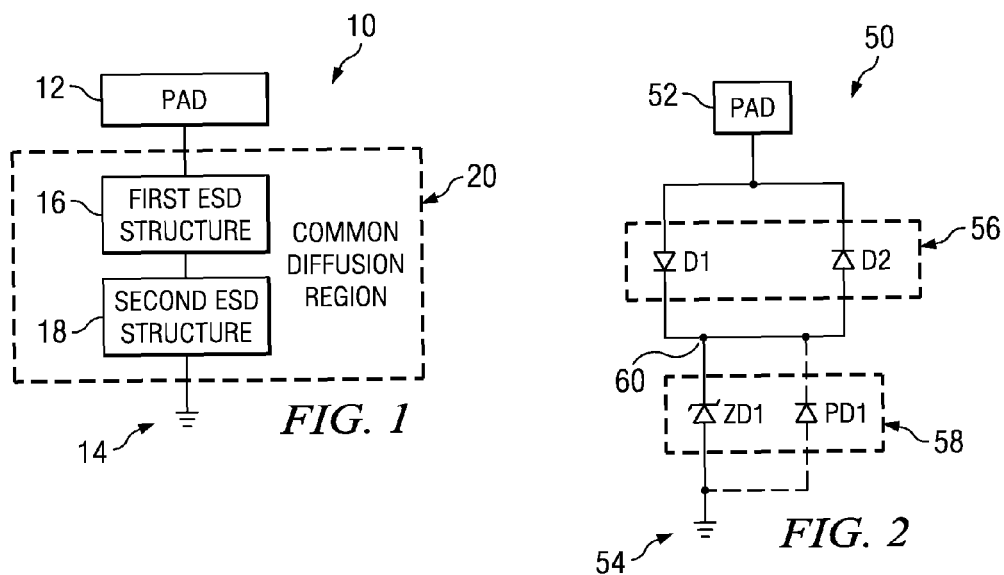
FIG. 1
FIG. 2
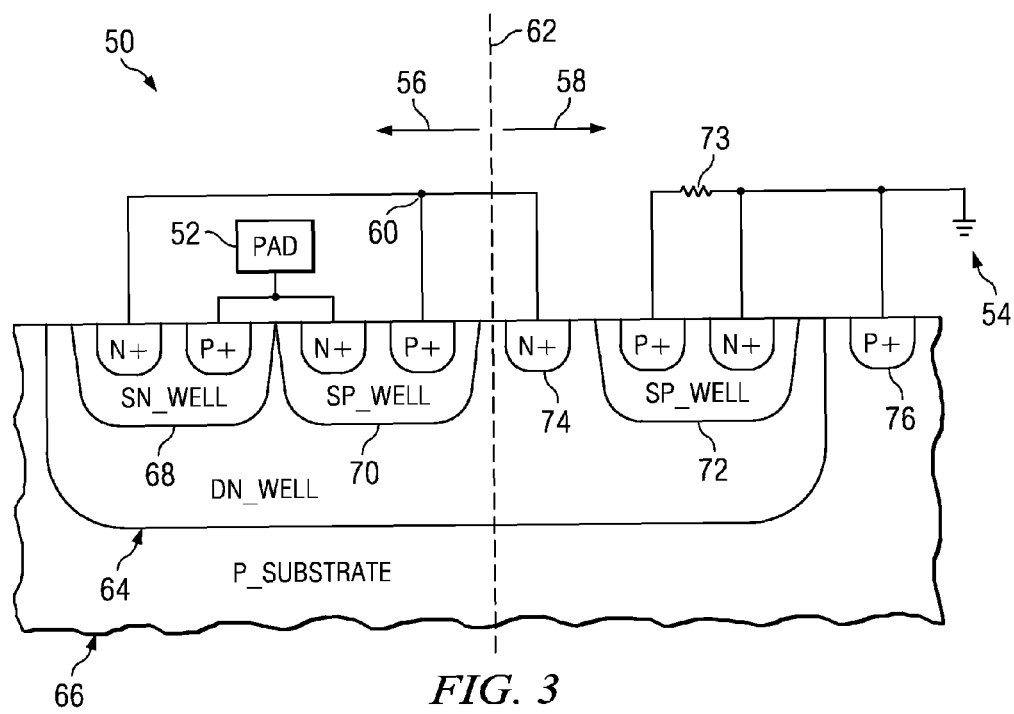
FIG. 3

1

INTEGRATED ESD PROTECTION DEVICE

TECHNICAL FIELD

This invention relates to integrated circuits, and more specifically relates to an integrated electrostatic discharge (ESD) protection device.

BACKGROUND

As semiconductor technology has constantly been improving, the use of field effect transistors (FETs) has become more prevalent in all facets of computer and communications technology. This technological improvement has allowed for faster operation and more compact arrangement of FETs within integrated circuit (IC) chips. IC chips are widely used in all electronic equipment, including equipment that is manufactured and operated in harsh environments. However, such harsh environments increase the likelihood of exposure of IC chips to high-voltage electrostatic discharge (ESD) events, to which IC chips are vulnerable. The high current that results from ESD events breaks down the internal semiconductor material of the FETs, resulting in damage to the IC chip. The vulnerability of IC chips to ESD events has created an important need for ESD protection circuits.

Typically, ESD circuits are designed to protect a given device from ESD events that occur from a given terminal or node to ground. However, in some applications, a ground potential can experience a voltage shift or a pin can have a negative voltage transient relative to a substrate, which could be grounded. For example, in an automotive environment, ground can shift approximately 2 volts across the body of a car. Such negative voltage events can result in significant leakage current from ground to a given terminal through the ESD protection device, which may result in damage to the ESD protection device.

One solution to this and other negative voltage shifts is the implementation of ESD protection devices in series with each other, each providing a respective direction of ESD protection. However, providing series connected ESD protection devices may not be able to provide the desired voltage characteristics for ESD protection in both directions. For example, the ESD current may not flow uniformly through the device, such that one of the ESD protection devices may break down during an ESD event in one or both directions. In addition, such an arrangement can be both cumbersome and costly. Another potential solution can include a resistor connected in series with the ESD protection device. However, such an arrangement can create an unacceptable voltage drop in the typical operation of the IC and can potentially degrade the ESD protection capability.

SUMMARY

One embodiment of the present invention provides an integrated electrostatic discharge (ESD) device. The integrated ESD device includes a first ESD structure coupled to a pad terminal of the integrated ESD device and a second ESD structure coupled to a ground terminal of the integrated ESD device. The integrated ESD device also includes a diffusion region that is shared by each of the first ESD structure and the second ESD structure, such that the shared diffusion region forms a portion of at least one semiconductor junction associated with each of the first ESD structure and the second ESD structure.

Another embodiment of the present invention provides an integrated ESD device. The integrated ESD device includes means for providing ESD protection against an ESD event on a pad terminal of the integrated ESD device relative to a ground terminal of the integrated ESD device, the means for providing ESD protection being coupled between the ground terminal and a node. The integrated ESD device also includes means for providing leakage current protection against a leakage current associated with a negative voltage potential on the pad terminal relative to a substrate voltage, the means for providing leakage current protection being coupled between the node and the pad terminal. The integrated ESD device also includes shared means for providing a portion of at least one semiconductor junction in both the means for providing ESD protection and the means for providing leakage current protection.

Another embodiment of the present invention provides an integrated ESD device. The integrated ESD device includes a substrate and a semiconductor well formed in the substrate to define a shared well. A first plurality of doped, shallow semiconductor wells are formed in the shared well to form portions of a first ESD structure, at least some first regions of the first plurality of shallow wells being coupled to a pad terminal of the integrated ESD device, and at least some second regions of the first plurality of shallow wells being coupled to a node. At least one second doped, shallow semiconductor well is formed in the shared well to form a portion of a second ESD structure. At least one region of the at least one second shallow well is electrically coupled to a ground terminal of the integrated ESD device, and another region of the at least one second shallow well is electrically coupled with the node, such that the first and second ESD structures are electrically connected in series between the pad terminal and the ground terminal.

BRIEF DESCRIPTION OF THE DRAWINGS

FIG. 1 illustrates an example of a schematic block diagram of an integrated ESD device in accordance with an aspect of the invention.

FIG. 2 illustrates an example of a circuit diagram of an integrated ESD device in accordance with an aspect of the invention.

FIG. 3 illustrates an example of a cross-sectional diffusion layout of the integrated ESD device of FIG. 2 in accordance with an aspect of the invention.

DETAILED DESCRIPTION

Figure 4:
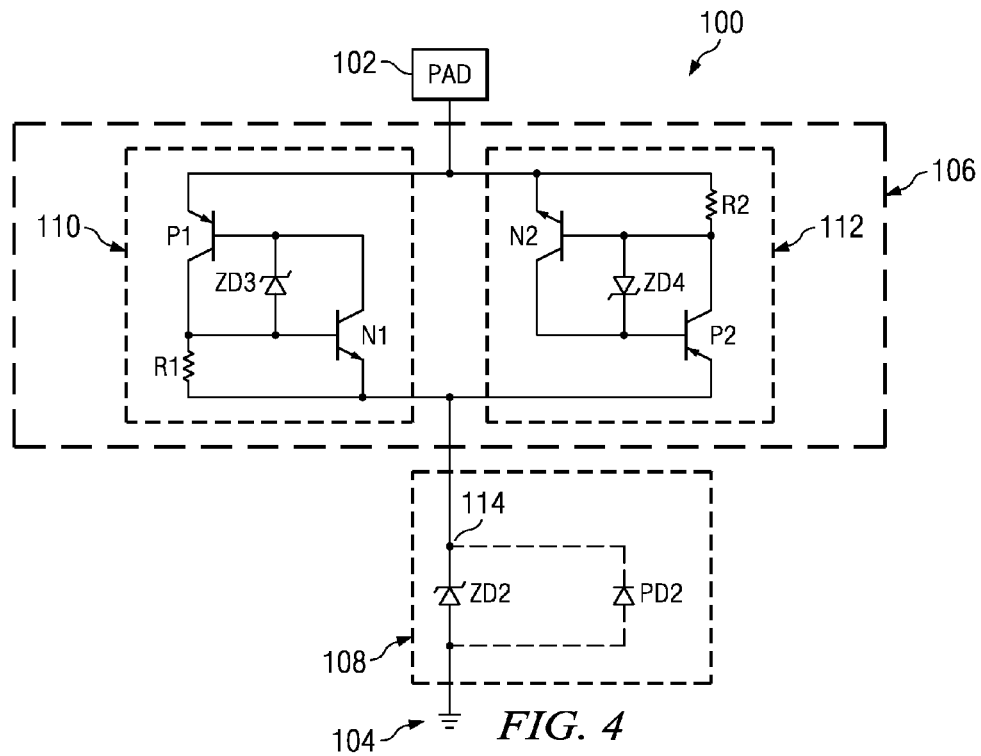
FIG. 4 illustrates an example of a circuit diagram of another integrated ESD device in accordance with an aspect of the invention.

The present invention relates to integrated circuits, and more specifically relates to an integrated electrostatic discharge (ESD) protection device. Two or more separate ESD structures can be integrated together to form an integrated ESD device having a common diffusion region. For instance, one ESD structure could be parallel connected diodes, with an anode of each being connected to a cathode of the other. Alternatively, the first ESD structure could be a bi-directional semiconductor-controlled (or silicon-controlled) rectifier (SCR) circuit. The second ESD structure could be a Zener diode. The common diffusion region in the ESD device could form a portion of at least one semiconductor junction associated with each of the two separate ESD structures. In addition, the merging of the two ESD structures that share the common diffusion region could enable electrical protection characteristics that differ from a series connection of individual devices. Furthermore, by merging the two ESD structures to share the common diffusion region, the integrated ESD device could have desirable ESD activation characteristics without a voltage breakdown of either individual ESD structure.

FIG. 1 illustrates an example of a diagram of an integrated ESD device 10 in accordance with an aspect of the invention. The integrated ESD device 10 is interconnected between a pad terminal 12 and a low voltage supply terminal, illustrated in the example of FIG. 1 as a ground terminal 14. The pad terminal 12 and the ground terminal 14 could each correspond to pins on an integrated circuit (IC). Therefore, the integrated ESD device 10 is operative to protect associated circuitry (e.g., on the IC) from damage resulting from an ESD event between the pad terminal 12 and the ground terminal 14. For example, a vulnerable circuit device (not shown, but part of the IC) could be coupled to the pad terminal 12, such that an ESD event could cause damage and possibly failure of the vulnerable circuit device. As used herein, the term "vulnerable" refers to the exposure of such circuitry to ESD events at the pad terminal 12, which might be detrimental to such circuitry. The vulnerable circuitry might be in the IC, or otherwise electrically coupled (directly or indirectly) with the pad terminal 12. The integrated ESD device 10 can activate upon the occurrence of the ESD event to divert current from the pad terminal 12 to the ground terminal 14 through the integrated ESD device 10. In this way, current does not flow through the vulnerable circuitry, thus preventing damage to the more vulnerable circuitry.

The integrated ESD device includes a first ESD structure 16 and a second ESD structure 18. For example, the first ESD structure could be a pair of parallel connected diodes, such that an anode of each diode is connected to a cathode of the other diode. Such an arrangement can provide a low-resistance current flow from the given pad terminal to the given ground terminal or from the given ground terminal to the given pad terminal. As an alternative, the first ESD structure could be a bi-directional SCR circuit, such that the first ESD structure could activate based on a given positive voltage potential at either the given pad terminal or the given ground terminal. The bi-directional SCR circuit could thus clamp and dissipate current flowing in either direction. As another example, the second ESD structure can include a Zener diode configured to operate in a reverse-bias state relative to a given pad terminal, or an NPN transistor operating in an emitter-collector rejection (ECR) mode.

The first ESD structure 16 and the second ESD structure 18 are coupled together via a common diffusion region 20. The common diffusion region 20 can be a semiconductor layer or well within the integrated ESD device 10 that is shared by each of the first ESD structure 16 and the second ESD structure 18. For example, the common diffusion region 20 could form a portion of one or more semiconductor junctions associated with each of the first ESD structure 16 and the second ESD structure 18. In other words, the common diffusion region 20 can provide a doped semiconductor material that forms a portion of at least one PN (or NP) junction associated with both the first ESD structure 16 and the second ESD structure 18.

By sharing the common diffusion region 20, the first ESD structure 16 and the second ESD structure 18 can be merged to form the integrated ESD device 10. As such, an ESD event occurring at the pad terminal 12 can be diverted through integrated ESD device 10 via the first ESD structure 16 and the second ESD structure 18. The common diffusion region 20 helps to ensure that current flows uniformly through the entirety of the integrated ESD device 10 from the pad terminal 12 to the ground terminal 14 without breaking down either the first ESD structure 16 or the second ESD structure 18. For example, the common diffusion region 20, along with a substrate (not shown) of the integrated ESD device 10, can create a parasitic diode having a reverse-bias breakdown voltage that is sufficient to prevent breakdown of the integrated ESD device 10 during an ESD event. This integrated configuration can be contrasted with potential ESD breakdown of a reverse-bias parasitic diode that may be applicable to the first ESD structure 16 and/or the second ESD structure 18 if each structure were implemented individually as separate, electrically coupled devices. In addition, integrating the first ESD structure 16 and the second ESD structure 18 can afford a much smaller IC package than if the structures were formed individually. Therefore, the integrated ESD device 10 is consistent with the demand for smaller electronic packages.

The first ESD structure 16, when configured as part of the integrated ESD device 10, can also afford protection against leakage current resulting from a negative voltage potential at the pad terminal 12 relative to the voltage of the substrate of the integrated ESD device 10, which could be electrically coupled to (or be at the same voltage as) the ground terminal 14. For example, the first ESD structure 16 can prevent leakage current flow through the integrated ESD device 10 such as for changes in voltage at the ground terminal 14 up to a negative voltage shift protection voltage. Such a leakage current can flow from the substrate, which could be grounded, to the pad terminal, for example, in response to a negative shift in the voltage of the substrate that exceeds the negative voltage shift protection voltage. The first ESD structure 16 can be configured to have an additive effect on the capability of the second ESD structure 18 regarding the negative voltage shift protection voltage that operate to prevent current flow from the ground terminal 14 to the pad terminal 12 for negative voltage shifts that are within the negative voltage shift protection voltage. The first and second ESD structures 16 and 18 can be configured so that the negative voltage shift protection voltage is at least 1V (corresponding −1V relative to the pad terminal). In addition, the first ESD structure 16, by sharing the common diffusion region 20 with the second ESD structure 18, can provide the protection against leakage current without a detrimental effect on the ESD protection capability of the integrated ESD device 10. For example, connecting a resistor in series with the second ESD structure 18 can create a voltage drop that could be unacceptable for certain ESD protection specifications and can degrade operation of the respective IC.

FIG. 2 illustrates an example of a circuit diagram of an integrated ESD device 50 in accordance with an aspect of the invention. The integrated ESD device 50 is interconnected between a pad terminal 52 and a negative supply voltage terminal, illustrated in the example of FIG. 2 as a ground terminal 54. The pad terminal 52 and the ground terminal 54 could each be pins on an IC. Therefore, the integrated ESD device 50 is operative to protect an associated circuit on the IC (or otherwise coupled to the pad terminal) from damage resulting from an ESD event between the pad terminal 52 and ground.

The integrated ESD device includes a first ESD structure 56, illustrated in the example of FIG. 2 as a first diode D1 connected in parallel with a second diode D2. The first diode D1 has an anode coupled to a cathode of the second diode D2 and to the pad terminal 52. The first diode D1 also has a cathode coupled to an anode of the second diode D2. The cathode of the first diode D1 and the anode of D2 are also coupled to a second ESD structure 58 at a node 60. In the example of FIG. 2, the second ESD structure 58 is implemented as a Zener diode ZD1. The first ESD structure 56 can provide a low-resistance current flow path from the pad terminal 52 to the node 60, or from the node 60 to the pad terminal 52. For example, each of the first diode D1 and the second diode D2 could have a forward-bias activation voltage characteristic of approximately 1 volt. Therefore, current flowing in either direction through the first ESD structure 56 can flow through a diode operating in a forward-bias state.

The Zener diode ZD1 is configured with an anode coupled to the ground terminal 54 and a cathode coupled to the node 60. It is to be understood that the example of FIG. 2 is not limited to the use of the Zener diode ZD1 as the second ESD structure 58, but that other types of ESD devices can be used in accordance with an aspect of the invention. For example, the second ESD structure 58 could be implemented as an NPN transistor operating in an ECR mode. As another example, other types of applicable ESD structures can include metal oxide varistors (MOVs), transient voltage suppression (TVS) diodes, and regular complementary metal oxide semiconductor (CMOS) devices, bipolar clamp diodes, and combinations thereof.

In the example of FIG. 2, current resulting from an ESD event at the pad terminal 52 relative to the ground terminal 54 can flow through the Zener diode ZD1 in a reverse-bias state, such as if the voltage exceeds the breakdown or Zener voltage. Similarly, leakage current resulting from a negative voltage shift can flow from the ground terminal 54 to the pad terminal 52 through the Zener diode ZD1 in a forward-bias state. However, because the Zener diode ZD1 can operate in a reverse-bias state during an ESD event, the second ESD structure 58 has an ESD activation voltage that can be significantly greater than the forward-bias activation resulting from a negative voltage shift. As an example, the second ESD structure 58 (by itself) could have an ESD activation voltage of greater than or equal to 40 volts at the node 60 relative to the ground terminal 54 and a 1 V forward-bias negative voltage shift protection voltage from the ground terminal 54 to the node 60.

FIG. 3 illustrates an example of a cross-sectional diffusion layout of the integrated ESD device 50 in the example of FIG. 2 in accordance with an aspect of the invention. It is to be understood that the following discussion is in reference to both FIGS. 2 and 3. Therefore, like reference numbers will be used in the description of the example of FIG. 3 to refer to structure previously introduced with respect to FIG. 2. In the example of FIG. 3, a dashed line 62 illustrates the separation between the first ESD structure 56, depicted on the left of the dashed line 62, and the second ESD structure 58, depicted on the right of the dashed line 62. The first ESD structure 56 and the second ESD structure 58 are illustrated in the example of FIG. 3 as being formed in a common diffusion region 64. In the example of FIG. 3, the common diffusion region 64 is demonstrated as an N-type well (hereinafter "DN_well"). The common diffusion region 64 is formed in a P-type substrate 66. The first ESD structure 56 includes a shallow N-type well (hereinafter "SN_well") 68 and a shallow P-type well (hereinafter "SP_well") 70 formed in the common diffusion region 64. N+ and P+ regions are doped in each of the respective SN_well 68 and SP_well 70. The pad 52 is electrically connected (e.g., by metallization or other connections) to the P+ region of the SN_well 68 and to the N+ region of the SP_well 70. The N+ region of the SN_well 68 and the P+ region of the SP_well 70 are electrically connected with the node 60.

The second ESD structure 58 is defined by a SP_well 72 and an N+ region 74 formed in the common diffusion region 64, as well as a P+ region 76 formed in the P-type substrate 66. P+ and N+ regions are also doped into the SP_well 72. A resistor 73 can electrically couple the P+ and N+ regions, with the N+ region being further electrically connected with the ground terminal 54. The N+ region 74 further can be coupled to the node 60 and the other N+ region of the second ESD structure 58 can be coupled to the ground terminal 54. It is to be understood that FIG. 3 is merely an example of a diffusion layout of the integrated ESD device 50, and that other arrangements of the integrated ESD device 50 are possible, such as relative positioning of the first ESD structure 56 and the second ESD structure 58, as well as relative doping of the semiconductor regions. It is also to be understood that, in the example of FIG. 3, semiconductor regions of a like type (i.e., N-type or P-type) can be doped at the same or similar levels of concentrations using known dopants. Alternatively, different dopant concentrations can be utilized.

The first ESD structure 56 and the second ESD structure 58 are formed as part of an integrated structure together within the DN_well that forms the common diffusion region 64. It is to be understood that, in the example of FIG. 2, the common diffusion region 64 is not shown, as FIG. 2 depicts a circuit diagram representation for the integrated ESD device 50. In the example of FIG. 3, by virtue of the relative N-type doping between the SP_well 70 and the DN_well (the common diffusion region) 64 being at the same voltage potential, the common diffusion region 64 forms part of a PN junction associated with both the first diode D1 and with the Zener diode ZD1. That is, the common diffusion region 64 is shared by the first ESD structure 56 and the second ESD structure 58, such that it forms a portion of a semiconductor PN junction for both the first ESD structure 56 and the second ESD structure 58.

By sharing the common diffusion region 64, the first ESD structure 56 and the second ESD structure 58 can be merged to form the integrated ESD device 50. As such, an ESD event occurring at the pad terminal 52 can be diverted through integrated ESD device 50 via cooperation of the first ESD structure 56 and the second ESD structure 58. For example, current resulting from an ESD event can flow from the pad terminal 52, through the first diode D1 operating in a forward-bias state, through the Zener diode ZD1 operating in a reverse-bias state, and to the ground terminal 54. The integration of the first ESD structure 56 and the second ESD structure 58 could provide an ESD activation voltage of, for example, greater than or equal to +41 volts for the integrated ESD device 50, resulting from the ESD activation voltage of greater than or equal to +40 volts of the Zener diode ZD1 and the +1 volt forward-bias activation voltage of the first diode D1.

In addition, the shared common diffusion region 64 helps to ensure that current flows uniformly through the entirety of the integrated ESD device 50 from the pad terminal 52 to the ground terminal 54 without breaking down either the first ESD structure 56 or the second ESD structure 58. In the example of FIG. 2, a parasitic diode PD1 is configured with a cathode coupled to the node 60 and an anode coupled to the ground terminal 54. The parasitic diode PD1 results from the semiconductor junction between the P-type substrate 66 and the N-type common diffusion region 64, such as depicted in the example of FIG. 3. Because the first ESD structure 56 and the second ESD structure 58 share the common diffusion region 64, the parasitic diode PD1 exhibits a reverse-bias breakdown voltage that is sufficient to prevent breakdown of the integrated ESD device 50 during an ESD event. In the example of FIG. 2, the parasitic diode PD1 is configured in a reverse-bias state such that current flow from the pad 52 to the ground terminal 54 is forced through the entire integrated ESD device 50. Without a sufficient reverse-bias breakdown voltage of the parasitic diode PD1, an ESD event could breakdown the parasitic diode PD1 and ESD current could bypass either the first ESD structure 56 of the second ESD structure 58. Such a breakdown could be damaging to the integrated ESD device 50, and as such is undesirable. To substantially prevent breakdown of the parasitic diode PD1, the common diffusion region 64 can, for example, be configured as sufficiently spacing the shallow wells 68, 70, and 72, from the P-type substrate 66 to provide a substantially higher reverse-bias breakdown voltage of the parasitic diode PD1 (e.g., 60 volts or more). For example, the common diffusion region 64 can be a deep well relative to the shallow wells 68, 70, and 72. Accordingly, an ESD event occurring at the pad terminal 52 flows uniformly through the first ESD structure 56 and the second ESD structure 58, as opposed to breaking down the parasitic diode PD1. This occurs because the parasitic diode PD1 is configured to have a reverse-bias breakdown voltage that is substantially greater than the ESD activation voltage of the integrated ESD device 50.

Absent the shared common diffusion region 64, each of the first ESD structure 56 and the second ESD structure 58 could have a separate, individual parasitic diode, each with a separate reverse-bias breakdown voltage. For example, the first ESD structure 56, standing alone, may not have the shallow wells spaced-apart enough from the substrate, and could thus have a parasitic diode with a reverse-bias breakdown voltage of about 20 volts. Therefore, an ESD event of at least 40 volts occurring at the pad terminal 52, resulting in current flow through the individually connected first ESD structure 56 and second ESD structure 58, could breakdown the first ESD structure 56, thus resulting in damage to the device. Accordingly, by integrating the first ESD structure 56 and the second ESD structure 58 to share the common diffusion region 64, the parasitic diode PD1 has a sufficient reverse-bias voltage to substantially prevent breakdown during an ESD event. Since this reverse-bias breakdown voltage of the parasitic diode PD1 is greater than the activation voltage of the integrated ESD structure 50, current can flow uniformly through the integrated ESD device 50 via the first ESD structure 56 and the second ESD structure 58.

The first ESD structure 56, as part of the integrated ESD device 50, can also provide leakage current protection resulting from a negative voltage at the pad terminal 52 relative to the P-type substrate 66. Such a leakage current can result, in the example of FIG. 3, from a negative voltage shift occurring at the ground terminal 54. For example, the leakage current can flow from the ground terminal 54, through the Zener diode ZD1 operating in a forward-bias state, through the second diode D2 operating in a forward-bias state, and to the pad terminal 52. As such, the first ESD structure 56 is configured to have an additive effect on the capability of the second ESD structure 58 regarding a negative voltage shift protection voltage due to fluctuations in the voltage at the ground terminal 54. For example, the 1 volt forward-bias activation voltage of the Zener diode ZD1 can be combined with the 1 volt forward-bias activation voltage of the second diode D2, such that the integrated ESD device 50 has a negative voltage shift protection voltage of 2 volts. The negative voltage shift protection voltage of the integrated ESD device 50 enables prevention of leakage current flow associated with a negative voltage shift that resides within the 2V, such that neither of the ESD structures 56 and 58 are biased in a way that might damage the integrated ESD device 50. Continuing with the above example of FIGS. 2 and 3, the integrated ESD device 50 can thus be implemented to have an ESD activation voltage from the pad terminal 52 to the ground terminal 54 of greater than or equal to +41 volts, and a negative voltage shift protection voltage of approximately −2V.

FIG. 4 illustrates another example of a circuit diagram of an integrated ESD device 100 in accordance with an aspect of the invention. The integrated ESD device 100 is interconnected between a pad terminal 102 and a negative supply voltage terminal, illustrated in the example of FIG. 4 as a ground terminal 104. The pad terminal 102 and the ground terminal 104 could each be pins on an IC. The integrated ESD device 100 is configured to protect associated circuitry (e.g., in the IC) from damage resulting from an ESD event that occurs between the pad terminal 102 and the ground terminal 104.

The integrated ESD device 100 includes a first ESD structure 106, illustrated in the example of FIG. 4 as a bi-directional SCR circuit, and a second ESD structure 108, illustrated in the example of FIG. 4 as a Zener diode ZD2. The first ESD structure 106 includes a first SCR structure 110 and a second SCR structure 112 interconnected in parallel between the pad terminal 102 and a node 114. The first SCR structure 110 includes a PNP bipolar junction transistor (BJT) P1, an NPN BJT N1, a resistor R1, and a Zener diode ZD3 connected as shown in FIG. 4. The second SCR structure 112 includes a PNP BJT P2, an NPN BJT N2, a resistor R2, and a Zener diode ZD4 connected as shown in FIG. 4. In the example of FIG. 4, the first SCR structure 110 and the second SCR structure 112 are identical and oriented opposite each other with respect to the pad terminal 102 and the node 114. It is to be understood, however, that other types of ESD structures could be utilized instead of the structures in the example of FIG. 4. It is to be further understood that the first SCR structure 110 and the second SCR structure 112 need not be identical, but that different types of SCR structures can be implemented in the bi-directional SCR circuit of the first ESD structure 106.

The first SCR structure 110 can be configured to pass current flow from the pad terminal 102 to the node 114, and the second SCR structure 112 can be configured to pass current flow from the node 114 to the pad terminal 102. For example, each of the first SCR structure 110 and the second SCR structure 112 can each have an activation voltage of approximately 5 volts. It is to be understood, however, that each of the first SCR structure 110 and the second SCR structure 112 could each have an activation voltage of between approximately 1 and 10 volts, depending on how each is configured. Accordingly, at approximately 5 volts, a given one of the first SCR structure 110 and the second SCR structure 112 clamps and passes current until a lower voltage threshold (e.g., 1 volt) is achieved. Therefore, current can flow in either direction through the first ESD structure 106 based on the relative voltage potential between the pad 102 and the node 114.

The Zener diode ZD2 of second ESD structure 108 is configured with an anode coupled to the ground terminal 104 and a cathode coupled to the node 114. It is to be understood that the example of FIG. 4 is not limited to the use of the Zener diode ZD2, but that other types of ESD devices, such as an NPN transistor operating in an ECR mode, can be implemented in accordance with an aspect of the invention. In the example of FIG. 4, current resulting from an ESD event at the pad terminal 102 relative to the ground terminal 104 can flow through the Zener diode ZD2 in a reverse-bias state according to the breakdown voltage of the Zener diode ZD2. Similarly, leakage current resulting from a negative voltage shift can flow from the ground terminal 104 to the pad terminal 102 through the Zener diode ZD2 in a forward-bias state. However, because the Zener diode ZD2 can operate in a reverse-bias state during an ESD event, the second ESD structure 108 has an ESD activation voltage that can be significantly greater than the forward-bias state resulting from a negative voltage shift. As an example, the second ESD structure 58 (by itself) could have an ESD activation voltage of greater than or equal to 40 volts at the node 114 relative to the ground terminal 104 and a 1V forward-bias negative voltage shift protection voltage from the ground terminal 104 to the node 114.

Figure 5:
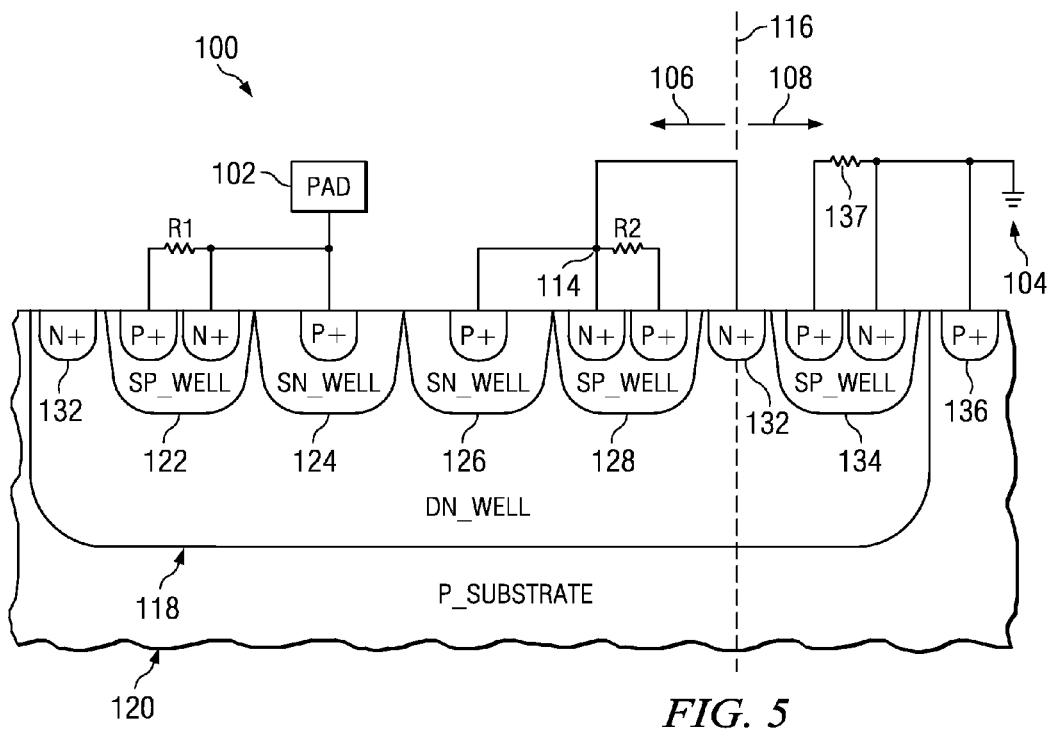
FIG. 5 illustrates an example of a cross-sectional diffusion layout of the integrated ESD device of FIG. 4 in accordance with an aspect of the invention.

FIG. 5 illustrates an example of a cross-sectional diffusion layout of the integrated ESD device 100 in the example of FIG. 4 in accordance with an aspect of the invention. It is to be understood that the following discussion is in reference to both FIGS. 4 and 5. Therefore, like reference numbers will be used in the description of the example of FIG. 5 to refer to structure previously introduced with respect to FIG. 4. In the example of FIG. 5, a dashed line 116 represents a separation between the first ESD structure 106, depicted on the left of the dashed line 116, and the second ESD structure 108, depicted on the right of the dashed line 116. The first ESD structure 106 and the second ESD structure 108 are illustrated in the example of FIG. 5 as shallow doped wells in a common diffusion region 118. The common diffusion region 118 is illustrated as a DN_well formed in a P-type substrate 120. The first ESD structure 106 includes a SP_well 122, a SN_well 124, a SN_well 126, a SP_well 128, and an N+ region 132 formed in the common diffusion region 118. It is to be understood that the N+ region 132, as demonstrated in the example of FIG. 5, substantially surrounds the SP_well 122, the SN_well 124, the SN_well 126, and the SP_well 128 as a loop. Each of the SP_wells 122 and 128 includes respective P+ and N+ regions formed therein by suitable dopants. A P+ region is formed in each of the SN_wells 124 and 126. The resistor R1 electrically connects the N+ and P+ regions of the SP_well 128. Similarly, the resistor R2 electrically connects the P+ and N+ regions of the SP_well 122. The P+ region of the SN_well 124 and the N+ region of the SN_well 124 are electrically coupled directly to the pad 102. The P+ region of the SN_well 126, the N+ region of the SP_well 128 and the N+ region 132 are electrically coupled directly to the node 114. The resistors R1 and R2 can be poly-silicon resistors.

The second ESD structure 108 includes a SP_well 134, an N+ region 132, and the N+ contact 132 formed in the common diffusion region 118, as well as a P+ region 136 in the P-type substrate 120. It is to be understood that the N+ region 132 is common to both the first ESD structure 106 and the second ESD structure 108. A P+ region and an N+ region are formed in the SP_well 134. A resistor 137 interconnects the P+ and N+ regions of the SP_well 134. The P+ region 136 and the N+ region of the SP_well 134 are electrically coupled directly to ground 104. As mentioned above the common N+ region 132 is coupled to the node 114.

It is also to be understood that FIG. 5 is merely an example of a diffusion layout of the integrated ESD device 100, and that other configurations of the integrated ESD device 100 are possible. For instance the relative positioning of the first ESD structure 106 and the second ESD structure 108, as well as relative doping of the semiconductor regions can vary from that shown and described herein. It is to be further understood that, in the example of FIG. 5, semiconductor regions of a like type (i.e., N-type or P-type) can be doped at the same or different levels of concentrations, and the particular dopant concentrations may vary according to design specifications.

As illustrated in FIG. 5, the first ESD structure 106 and the second ESD structure 108 are formed in the common diffusion region 118. It is to be understood that the common diffusion region 118 is not shown, as FIG. 4 is merely a circuit representation of the integrated ESD device 100. In the example of FIG. 5, the common diffusion region 118 defines a portion of the PN junctions associated with the transistors N1, N2, P1, and P2, as well as the Zener diodes ZD2, ZD3, and ZD4. Thus, the common diffusion region 118 is shared by the first ESD structure 106 and the second ESD structure 108, such that it forms a portion of semiconductor PN junctions associated with both the first ESD structure 106 and the second ESD structure 108.

By sharing the common diffusion region 118, the first ESD structure 106 and the second ESD structure 108 can be merged to form the integrated ESD device 100. As such, an ESD event occurring at the pad terminal 102 can be diverted through the integrated ESD device 100 via cooperation between the first ESD structure 106 and the second ESD structure 108. For example, current resulting from an ESD event can flow from the pad terminal 102, through the first SCR structure 110, through the Zener diode ZD2 operating in a reverse-bias state, and to the ground terminal 104. The integration of the first ESD structure 106 and the second ESD structure 108 could provide an ESD activation voltage of greater than or equal to +40 volts for the integrated ESD device 100, which is approximately the same as the second ESD structure 108 alone. It is to be understood that, due to the sharing of the common diffusion region 118 as demonstrated in the example of FIG. 5, the first ESD structure 106 does not have an additive effect on the ESD activation voltage of the integrated ESD device 100. Thus, the addition of the first ESD structure 106 to the second ESD structure 108 via the shared common diffusion region 118 has substantially no detrimental effect on the ESD protection capability of the second ESD structure 108.

In addition, the shared common diffusion region 118 helps to ensure that current flows uniformly through the entirety of the integrated ESD device 100 from the pad terminal 102 to the ground terminal 104 without breaking down either the first ESD structure 106 or the second ESD structure 108. For the example of FIG. 4, a parasitic diode PD2 has a cathode coupled to the node 114 and an anode coupled to the ground terminal 104. The parasitic diode PD2 results from the semiconductor junction between the P-type substrate 120 and the N-type common diffusion region 118, as demonstrated in the example of FIG. 5. Because the first ESD structure 106 and the second ESD structure 108 share the common diffusion region 118, the parasitic diode PD2 could have a reverse-bias breakdown voltage that is sufficient to prevent breakdown of the integrated ESD device 100 during an ESD event. In the example of FIG. 4, the parasitic diode PD2 is configured in a reverse-bias state such that current flow from the pad 102 to the ground terminal 104 is forced through the entire integrated ESD device 100. Therefore, as illustrated in the example of FIG. 5, by implementing the common diffusion region 118 as sufficiently spacing the shallow wells 122, 124, 126, 128, and 134 from the P-type substrate 120, a substantially higher reverse-bias breakdown voltage can exist for the parasitic diode PD2 (e.g., 60 volts or more). For example, the common diffusion region 118 can be a deep well relative to the shallow wells 122, 124, 126, 128, and 134. Accordingly, an ESD event occurring at the pad terminal 102 flows uniformly through the first ESD structure 106 and the second ESD structure 108, as opposed to breaking down the parasitic diode PD2, because the parasitic diode PD2 has a reverse-bias breakdown voltage that is substantially greater than the ESD activation voltage of the integrated ESD device 100.

Absent the shared common diffusion region 118, each of the first ESD structure 106 and the second ESD structure 108 could have separate, individual parasitic diodes, each with a separate reverse-bias breakdown voltage. For example, the first ESD structure 106, standing alone, may not have the shallow wells spaced-apart enough from the substrate, and could thus have a parasitic diode with a reduced reverse-bias breakdown voltage (e.g., approximately 20 volts). Therefore, an ESD event of at least 40 volts occurring at the pad terminal 102, resulting in current flow through the individually connected first ESD structure 106 and second ESD structure 108, could breakdown the first ESD structure 106, thus resulting in damage to the device. Accordingly, by integrating the first ESD structure 106 and the second ESD structure 108 to share the common diffusion region 118 (as shown in FIG. 5), the parasitic diode PD2 has a sufficient reverse-bias voltage to substantially prevent breakdown during an ESD event. The parasitic diode is further configured to have a reverse-bias breakdown voltage that exceeds the activation voltage of the integrated ESD device 100 to allow uniform current flow through the integrated ESD device 100 during ESD events.

The first ESD structure 106, if configured as part of the integrated ESD device 100, can also provide protection against leakage current resulting from a negative voltage at the pad terminal 102 relative to the P-type substrate 120. Such a leakage current can result, in the example of FIG. 5, from a negative voltage shift occurring at the ground terminal 104. For example, the leakage current can flow from the ground terminal 104, through the Zener diode ZD2 operating in a forward-bias state, through the second SCR structure, and to the pad terminal 102. As described above, the second SCR structure 112 can have an activation voltage of approximately 5 volts. As also described above, the Zener diode ZD2 can have a 1V activation voltage in the forward-bias, such as may result from a negative voltage shift. However, due to the clamping nature of a given SCR structure, as well as the sharing of the common diffusion region 118 by the first ESD structure 106 and the second ESD structure 108, the 5 volt activation voltage of the second SCR structure 112 is applicable to the entire integrated ESD device 100. That is, the 5 volt activation for first ESD structure 106 effectively dominates or overrides the 1 volt negative voltage shift protection voltage of the second ESD structure 108 with the 5V activation voltage for a negative leakage current associated with the integrated ESD device 100. Therefore, the integrated ESD device 100 can prevent leakage current resulting from up to a negative voltage shift protection voltage of approximately 5V (corresponding to –5V relative to the pad terminal) without causing damage to the integrated device. In the example just described, the integrated ESD device 100 can be implemented to have an ESD activation voltage from the pad terminal 102 to the ground terminal 104 of greater than or equal to +40 volts, and a negative voltage shift protection voltage of approximately –5V.

What have been described above are examples of the present invention. It is, of course, not possible to describe every conceivable combination of components or methodologies for purposes of describing the present invention, but one of ordinary skill in the art will recognize that many further combinations and permutations of the present invention are possible. For example, while example voltages and operating characteristics have been described herein, those skilled in the art will understand and appreciate that integrated ESD devices can be implemented with other voltage operating characteristics in accordance with present invention. Accordingly, the present invention is intended to embrace all such alterations, modifications, and variations that fall within the spirit and scope of the appended claims.

What is claimed is:

1. An integrated electrostatic discharge (ESD) device comprising:
   a first ESD structure coupled to a pad terminal of the integrated ESD device;
   a second ESD structure coupled to a ground terminal of the integrated ESD device; and
   a diffusion region that is shared by each of the first ESD structure and the second ESD structure, such that the shared diffusion region forms a portion of at least one semiconductor junction associated with each of the first ESD structure and the second ESD structure, wherein the first ESD structure comprises a bi-directional silicon-controlled rectifier (SCR) circuit.

2. The integrated ESD device of claim 1, wherein the integrated ESD device has a pad terminal to ground terminal ESD activation voltage that is approximately equal to an ESD activation voltage associated with the second ESD structure from the node to the ground terminal, and wherein the integrated ESD device has a negative voltage shift protection voltage that is approximately equal to an SCR activation voltage of the first ESD structure from the node to the pad terminal.

3. The integrated ESD device of claim 2, wherein the bi-directional SCR circuit comprises a first SCR structure and a second SCR structure, the first SCR structure and the second SCR structure being configured in opposite current flow directions and each comprising a PNP-type bipolar junction transistor (BJT) and an NPN-type BJT, the PNP-type BJT having a base coupled to a collector of the NPN-type BJT and the NPN-type BJT having a base coupled to a collector of the PNP-type BJT.

4. The integrated ESD device of claim 1, wherein the second ESD structure further comprises a Zener diode having an anode coupled to the ground terminal and a cathode coupled to the first ESD structure.

5. The integrated ESD device of claim 1, wherein the shared diffusion region comprises a deep semiconductor well formed in a substrate, each of the first ESD structure and the second ESD structure comprising a plurality of shallow semiconductor wells formed in the deep semiconductor well.

6. The integrated ESD device of claim 5, wherein the deep semiconductor well and the substrate cooperate to provide a parasitic diode having a reverse-bias breakdown voltage characteristic that is greater than a pad-to-ground ESD activation voltage of the integrated ESD device.

7. The integrated ESD device of claim 1, wherein the first ESD structure and the second ESD structure cooperate to provide a pad terminal to ground terminal activation voltage that is greater than about 40 volts and to provide a negative voltage shift protection voltage that prevents leakage current from the ground terminal to the pad terminal for negative shifts in voltage at a substrate of the integrated ESD device up to the negative voltage shift protection voltage, the negative voltage shift protection voltage being at least about –1 volt at the pad terminal relative to the ground terminal.

8. An integrated electrostatic discharge (ESD) device comprising:
   means for providing ESD protection against an ESD event on a pad terminal of the integrated ESD device relative to a ground terminal of the integrated ESD device, the means for providing ESD protection being coupled between the ground terminal and a node;
   means including a bi-directional semiconductor-controlled rectifier circuit coupled between the pad terminal and the node for providing leakage current protection against a leakage current associated with a negative voltage potential on the pad terminal relative to a substrate voltage of the integrated ESD device, the means for providing leakage current protection being coupled between the node and the pad terminal; and shared means for providing a portion of at least one semiconductor junction in both the means for providing ESD protection and the means for providing leakage current protection.

9. The integrated ESD device of claim 8, wherein the means for providing leakage current protection comprises a Zener diode having an anode coupled to the ground terminal and a cathode coupled to the node.

10. The integrated ESD device of claim 9, further comprising parasitic means for providing a reverse-bias breakdown voltage characteristic that is greater than a pad terminal-to-ground terminal ESD activation voltage of the integrated ESD device.

11. An integrated electrostatic discharge (ESD) device comprising:
  a substrate;
  a semiconductor well formed in the substrate to define a shared well;
  a first plurality of doped, shallow semiconductor wells formed in the shared well to form portions of a first ESD structure, at least some first regions of the first plurality of shallow wells being coupled to a pad terminal of the integrated ESD device, and at least some second regions of the first plurality of shallow wells being coupled to a node; and
  at least one second doped, shallow semiconductor well formed in the shared well to form a portion of a second ESD structure, at least one region of the at least one second shallow well being electrically coupled to a ground terminal of the integrated ESD device, another region of the at least one second shallow well being electrically coupled with the node, such that the first and second ESD structures are electrically connected in series between the pad terminal and the ground terminal, , wherein the first ESD structure is configured as a bi-directional semiconductor-controlled rectifier (SCR) circuit coupled between the pad terminal and the node, wherein the integrated ESD device has a pad terminal to ground terminal ESD activation voltage that is approximately equal to an ESD activation voltage associated with the second ESD structure from the node to the ground terminal, and wherein the integrated ESD device has a negative voltage shift protection voltage that is approximately equal to an SCR activation voltage of the first ESD structure from the node to the pad terminal.

12. The integrated ESD device of claim 11, wherein the integrated ESD device has a pad terminal to ground terminal ESD activation voltage that is approximately equal to a sum of a forward bias voltage of the first diode and an activation voltage of the second ESD structure from the node to the ground terminal, and wherein the integrated ESD device has a negative voltage shift protection voltage that is approximately equal to a sum of a bias voltage of the second ESD structure from the ground terminal to the node and a forward bias voltage of the second diode.

13. The integrated ESD device of claim 11, wherein the second ESD structure is configured as a Zener diode having an anode coupled to the ground terminal and a cathode coupled to the node.

14. The integrated ESD device of claim 11, wherein the shared well and the substrate provide a parasitic diode having a reverse-bias breakdown voltage characteristic that is greater than a pad-to-ground ESD activation voltage of the integrated ESD device.

* * * * *